(12) United States Patent
Hsing Chen et al.

(10) Patent No.: US 9,257,620 B1
(45) Date of Patent: Feb. 9, 2016

(54) PACKAGE STRUCTURE OF LIGHT-EMITTING DIODE MODULE AND METHOD FOR MANUFACTURING THE SAME

(71) Applicant: PROLIGHT OPTO TECHNOLOGY CORPORATION, Taoyuan County (TW)

(72) Inventors: Chen-Lun Hsing Chen, Taoyuan County (TW); Feng-Chuan Tsai, Taoyuan County (TW); Jung-Hao Hung, Taoyuan County (TW)

(73) Assignee: Prolight Opto Technology Corporation, Taoyuan County (TW)

( * ) Notice: Subject to any disclaimer, the term of this patent is extended or adjusted under 35 U.S.C. 154(b) by 0 days.

(21) Appl. No.: 14/450,414

(22) Filed: Aug. 4, 2014

(51) Int. Cl.
*H01L 33/58* (2010.01)
*H01L 33/54* (2010.01)
*H01L 33/56* (2010.01)
*H01L 33/48* (2010.01)
*H01L 33/00* (2010.01)

(52) U.S. Cl.
CPC .............. *H01L 33/54* (2013.01); *H01L 33/005* (2013.01); *H01L 33/483* (2013.01); *H01L 33/56* (2013.01); *H01L 33/58* (2013.01); *H01L 2933/005* (2013.01)

(58) Field of Classification Search
CPC ................... H01L 2224/48091; H01L 33/58; H01L 25/0753; H01L 33/642; H01L 33/50; H01L 33/52; H01L 33/54; H01L 2933/0041
See application file for complete search history.

(56) References Cited

U.S. PATENT DOCUMENTS

| | | | |
|---|---|---|---|
| 8,941,137 B2 * | 1/2015 | Margalit | ........................ 257/98 |
| 2014/0042479 A1 * | 2/2014 | Margalit | ........................ 257/98 |

* cited by examiner

*Primary Examiner* — Roy Potter
*Assistant Examiner* — Paul Patton
(74) *Attorney, Agent, or Firm* — Rosenberg, Klein & Lee

(57) ABSTRACT

The present invention provides a package structure of LED module and the method for manufacturing the same. The method comprises steps of providing a light-emitting module; disposing a light-pervious member on the light-emitting path of the light-emitting module; and dripping a colloid member on the light-pervious member. The light-pervious member is a transparent structure; and the colloid member forms a transparent structure with a thick center and a thin periphery using the surface tension of colloid material. In the above structure, the light-pervious member and colloid member are used for reducing the total reflection effect in the package.

11 Claims, 8 Drawing Sheets

PACKAGE STRUCTURE OF LIGHT-EMITTING DIODE MODULE AND METHOD FOR MANUFACTURING THE SAME

FIELD OF THE INVENTION

The present invention relates generally to a structure for reducing total reflection of light-emitting diode chips, and particularly to a package structure of light-emitting diode module and the method for manufacturing the same.

BACKGROUND OF THE INVENTION

In the trend of energy shortage, energy conservation and carbon reduction have become the guidelines for everyone's living. Various manufacturing technologies using advanced technologies appear. Many industrial products and electronic products are invented, facilitating people's living significantly. Limit-emitting diodes (LEDs) have a special light-emitting mechanism and the advantages of environmental protection and energy conservation. Their applications are developing prosperously, including backlight plates of LCD, large signboards, headlights, and lighting applications. In Taiwan, early involvement was in die and wafer fabrication. At present, the LED industry has established a delicate division of the supply chain. In addition, the domestic LED companies all endeavor in improving their capabilities in research and development for expanding to high value-added markets. A part of the innovation is related to the package material and structure of LEDs.

Many industrial and electronic products are demanding increasingly in technologies. This is the case for LEDs particularly. These semiconductor devices are usually used as indicators or displays. They can convert electrical energy to photo energy directly with high efficiency. They also long usage hours as long as several tens to hundreds of thousands of hours. Moreover, in comparison with traditional bulbs, they also have the advantages of breakage resistance and saving power. Nonetheless, they all need a reasonable package form for various types before they are adopted in practical applications.

The package form of LED depends on the application scenario, the appearance, the size, the heat dissipation solution, and the light emitting effect. There are many types in the package forms of LED. Currently, according to the package forms, LED chips are categorized into Lamp-LED, TOP-LED, Side-LED, SMD-LED, Flip Chip-LED, and High-Power-LED.

In general, the overall light-emitting performance is influenced by the LED chip, the package form, and the package material. As the epitaxy technology progresses, the internal light-emitting efficiency of LED chip has reached above 90%. Nonetheless, owing to the influences of package structure and material, the equivalent light-emitting efficiency cannot be reached from the outside of LED modules. Thereby, the package structure and material of LED chips are important to the brightness of LED chips.

Accordingly, the present invention improves the drawbacks in the prior art and provides a package structure of LED module and the method for manufacturing the same. The method mainly comprises steps of providing a light-emitting module; disposing a light-pervious member on the light-emitting path of the light-emitting module; and dripping a colloid member on the light-pervious member. The light-pervious member is a transparent structure; and the colloid member forms a transparent structure with a thick center and a thin periphery using the surface tension of colloid material. By using the transparent structure of the light-pervious member and the colloid member described above, the total reflection effect in the package is reduced. Hence, the structure according to the present invention is endowed with nonobviousness and novelty.

SUMMARY

An objective of the present invention is to provide a package structure of LED module and the method for manufacturing the same. The light-pervious member and colloid member are used for reducing the total reflection effect in the package.

In order to achieve the objective and efficacy described above, the present invention provides a package structure of LED module and the method for manufacturing the same. The method mainly comprises steps of providing a light-emitting module; disposing a light-pervious member on the light-emitting path of the light-emitting module; and dripping a colloid member on the light-pervious member. The light-pervious member is a transparent structure; and the colloid member forms a transparent structure with a thick center and a thin periphery using the surface tension of colloid material.

DETAILED DESCRIPTION

In order to make the structure and characteristics as well as the effectiveness of the present invention to be further understood and recognized, the detailed description of the present invention is provided as follows along with embodiments and accompanying figures.

The package structure of LED module and the method for manufacturing the same according to the present invention solve the problem of larger refractivity in a general LED module than outside. In other words, most of the light generate by the LED module is totally reflected back to the inside of the LED module from the interface between the package structure and the LED module. The totally reflected light is absorbed by the internal electrodes and substrate. Thereby, the light extraction efficiency of the LED chip is far lower than the internal quantum efficiency. The present invention improves the drawbacks in the light emitting efficiency of the LED module according to the prior art. By using the light-pervious member and the colloid member, the total reflection effect in the package can be reduced. Hence, the structure according to the present invention is endowed with nonobviousness and novelty.

Figure 1:
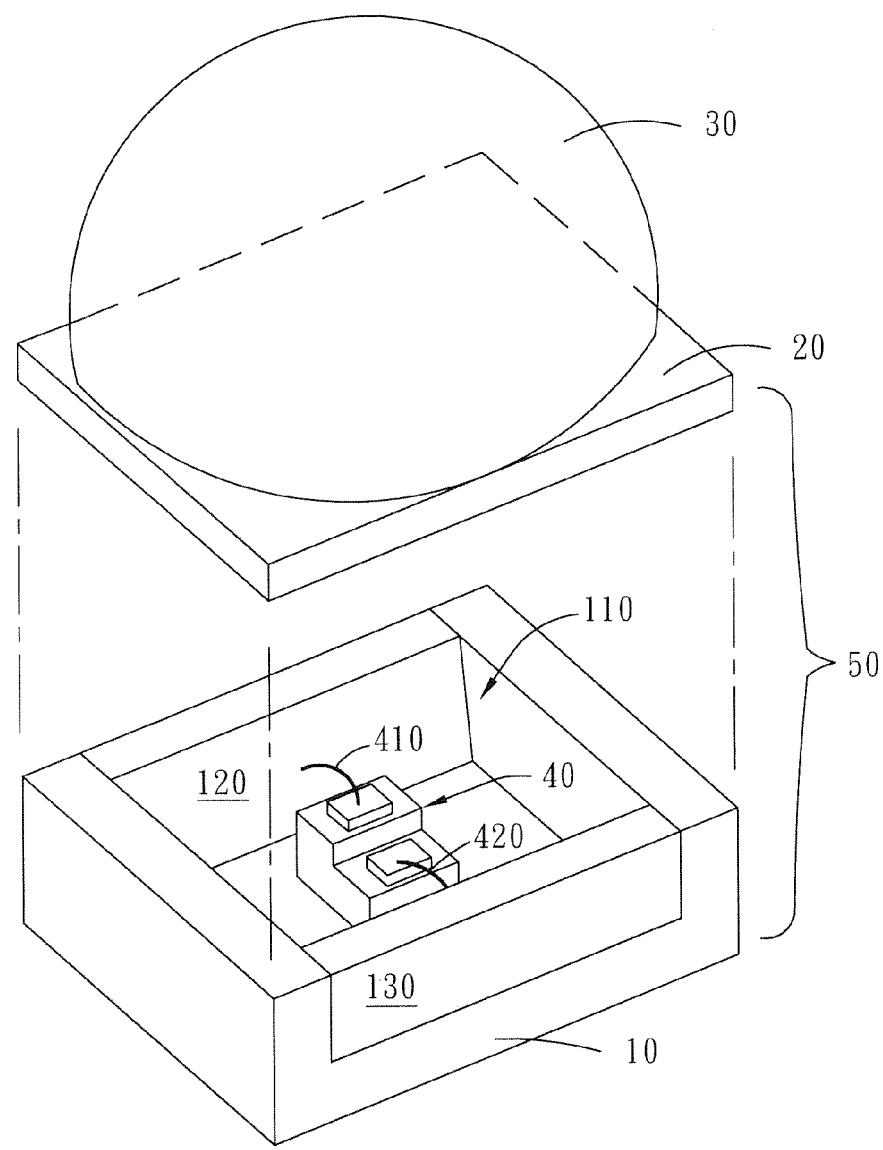
FIG. 1 shows a three-dimensional view of the package structure of LED module according the first embodiment of the present invention.

Please refer to FIG. 1, which shows a three-dimensional view of the package structure of LED module according the first embodiment of the present invention. As shown in the figure, the present invention uses a chip fixing member 10, a light-pervious member 20, a colloid member 30, and at least an LED chip 40. The chip fixing member 10 further includes a recess 110, a first electrode 120, and a second electrode 130. The LED chip 40 includes a first electrical connecting wire 410 and a second electrical connecting wire 420. The present invention includes the fundamental structure described above.

Figure 2:
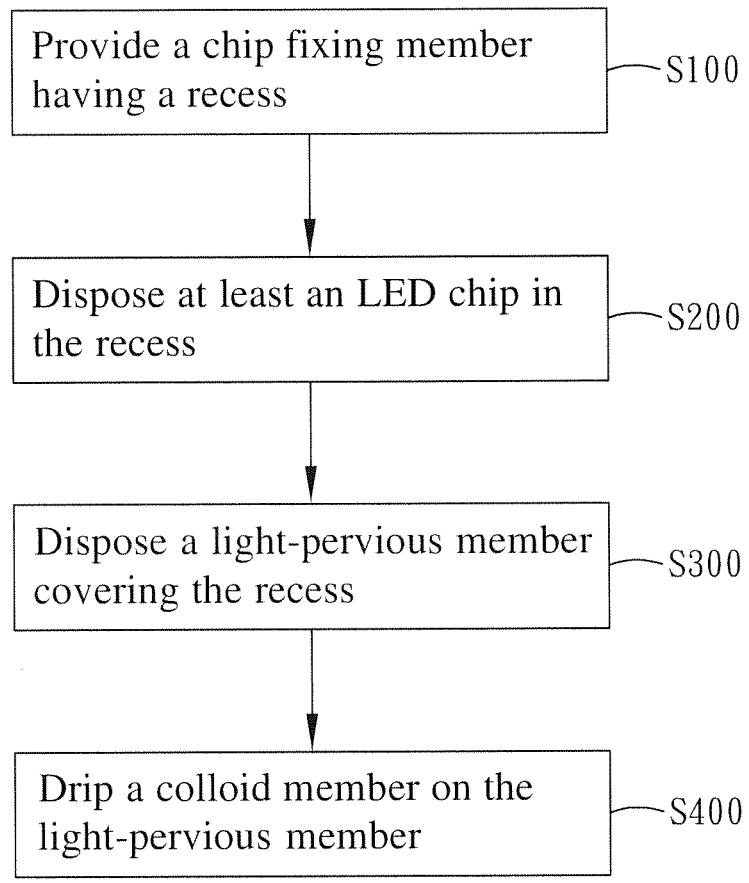
FIG. 2 shows a flowchart for manufacturing the package structure of LED module according the first embodiment of the present invention.

Please refer to FIG. 2, which shows a flowchart for manufacturing the package structure of LED module according the first embodiment of the present invention. As shown in the figure, in the step S100, first, the chip fixing member 10 provided. The chip fixing member 10 includes the recess 110. The first and second electrodes 120, 130 are disposed on the sidewalls of the recess 110 on both sides. Next, in the step S200, the at least one LED chip 40 is disposed in the recess 110 of the chip fixing member 10. The LED chip 40 has said first and second electrical connecting wires 410, 420. The first electrical connecting wire 410 is connected to the first electrode 120 and the second electrical connecting wire 420 is connected to the second electrode 130 for forming electrical circuitry. Then, in the step S300, the light-pervious member 20 is disposed on the recess 110 and thus covering the recess 110. Afterwards, in the step S400, the LED chip 40 is sealed in the recess 110 by using the chip fixing member 10 and the light-pervious member 20. The recess 110 is filled with air, transparent colloid material, or fluorescent powder for forming a light-emitting module 50. The light-emitting module 50 uses the first and second electrodes 120, 130 for connecting electrically the internal and external circuits. In addition, a colloid material is disposed on the light-pervious member 20 by dripping for forming a colloid member 30. The colloid member 30 is a transparent colloid material. Due to the surface tension of the colloid material, the structure has a thick center and a thin periphery, enabling the lens effect. Besides, the surface of the colloid member 30 is curved.

The present invention forms the light-emitting module 50 by using the chip fixing member 10, the light-pervious member 20, and the LED chip 40. The chip fixing member 10, the light-pervious member 20, and the colloid member 30 are all transparent structures. The chip fixing member 10 and the light-pervious member 20 can be glass or transparent ceramics. The colloid member 30 is made of silica gel materials, silica gel composite materials, epoxy resin, or epoxy resin composite materials. Thereby, the light emitted from the LED chip 40 inside the light-emitting module 50 will not be limited by the package structure of the light-emitting module 50. The light of the LED chip 40 passes through the light-emitting module 50 and emits outwards. By using the above method, the total reflection effect in the package structure of the light-emitting module 50 can be reduced. Furthermore, the structure formed by dripping of the colloid member 30 can be used. The colloid member 30 has a thick center and a thin periphery, forming a curved surface and enabling a convex lens effect. Consequently, the light of the LED chip 40 can be concentrated by passing through the colloid member 30.

Figure 3:
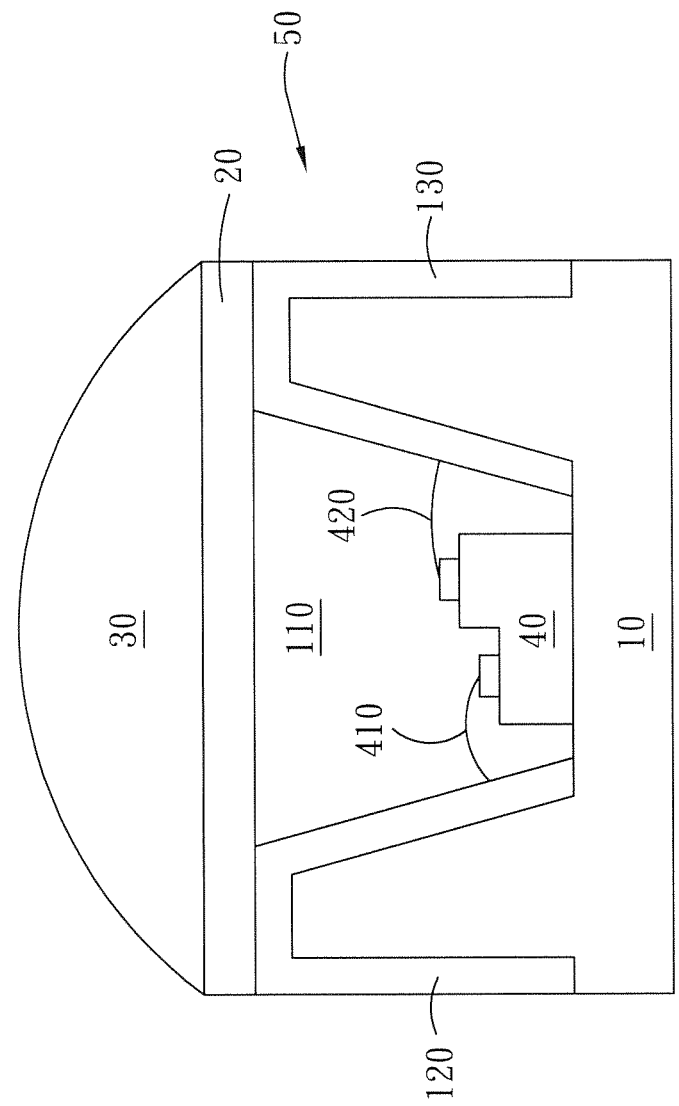
FIG. 3 shows a cross-sectional view of the package structure of LED module according the first embodiment of the present invention.
Figure 4:
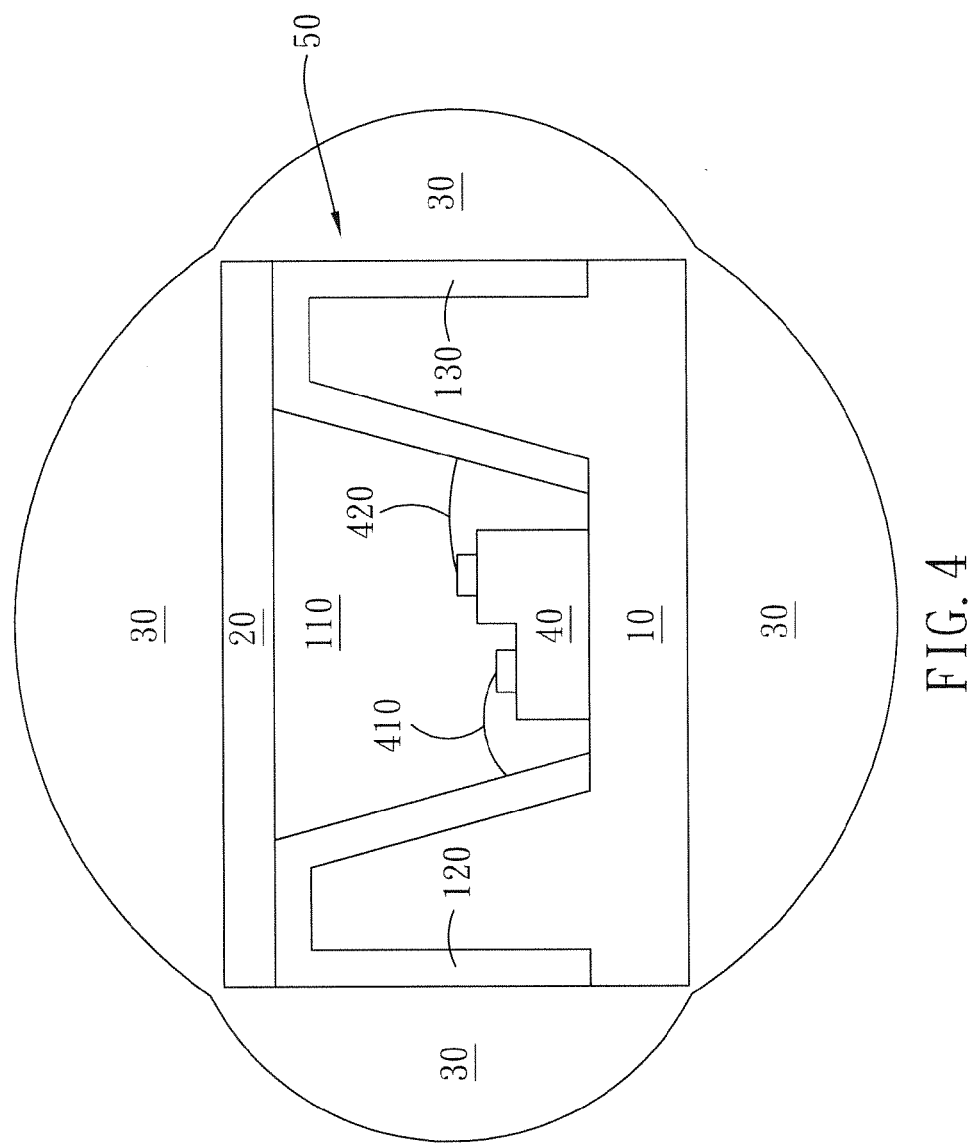
FIG. 4 shows a cross-sectional view of the package structure of LED module according the second embodiment of the present invention.

Please refer to FIG. 3 and FIG. 4, which show cross-sectional views of the package structure of LED module according the first and second embodiments of the present invention. As shown in the figures, the embodiment of the colloid member 30 according to the present invention is disclosed. The colloid member 30 is disposed on one side of the light-emitting module 50. According to the first embodiment, as shown in FIG. 3, the colloid member 30 is dripped on the light-pervious member 20. When the light of the LED chip 40 passes through the light-pervious member 20 and the colloid member 30, there will be no total reflection. Thereby, the light-emitting efficiency inside the light-emitting module 50 approaches that of outside. In addition, according to the second embodiment, the chip fixing member 10 is a transparent structure. At least one colloid member 30 is dripped on one side of the light-emitting module 50, as shown in FIG. 3. Alternatively, the colloid member 30 is dripped surrounding the light-emitting module 50, as shown in FIG. 4, so that the light-emitting paths of the LED chip 40 inside the light-emitting module 50 are all surrounded by the colloid member 30. The light emitted by the LED chip 40 will pass through the colloid member 30, which is a structure formed integrally. Furthermore, according to both of the two embodiments described above, a plurality of LED chips 40 can be disposed in the recess 110. Besides, the fluorescent powder 60 (not shown in the figures) can be filled inside the recess 110 for covering the light-emitting paths of the LED chips 40. Consequently, the LED chip 40 can be adjusted for emitting the required color of light.

Figure 5:
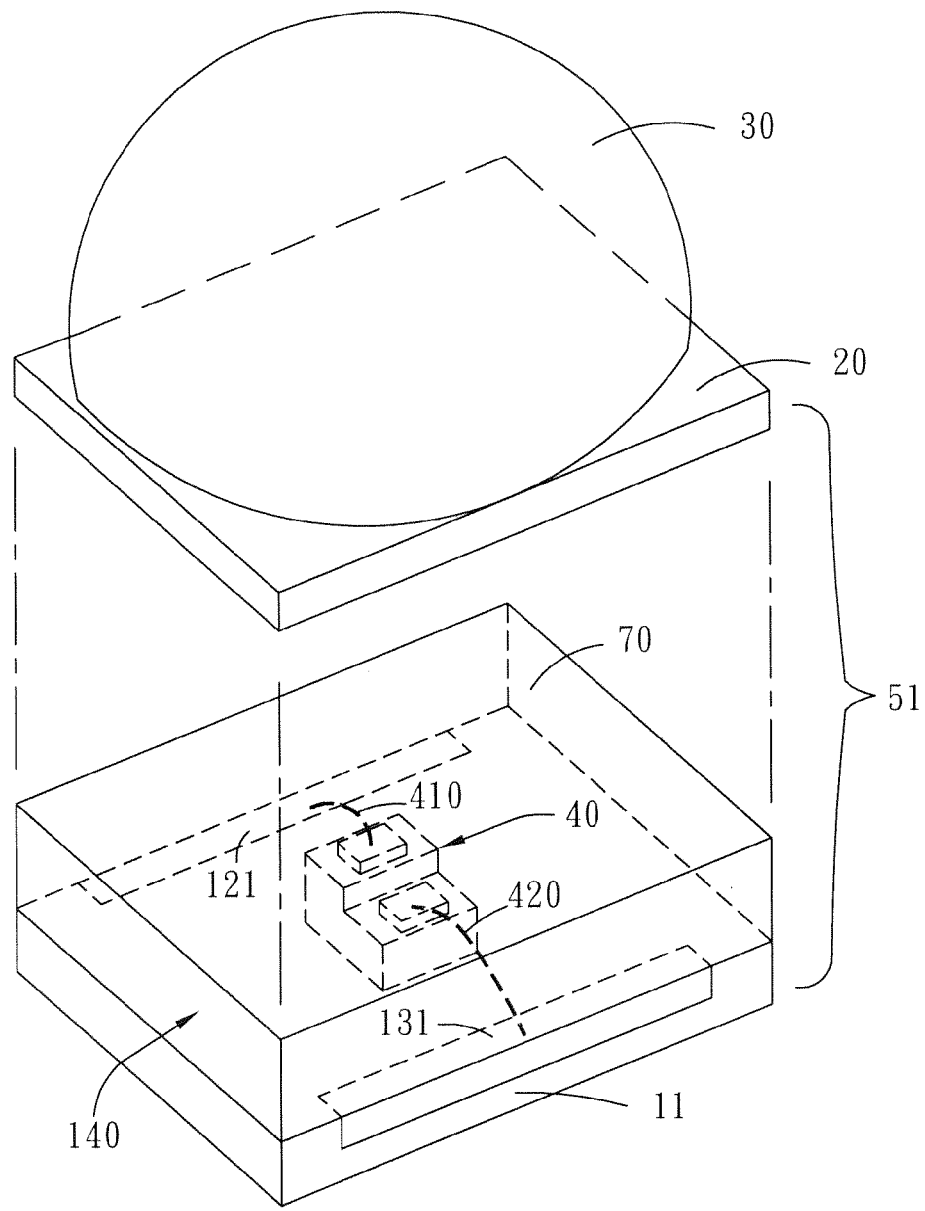
FIG. 5 shows a three-dimensional view of the package structure of LED module according the third embodiment of the present invention.
Figure 6:
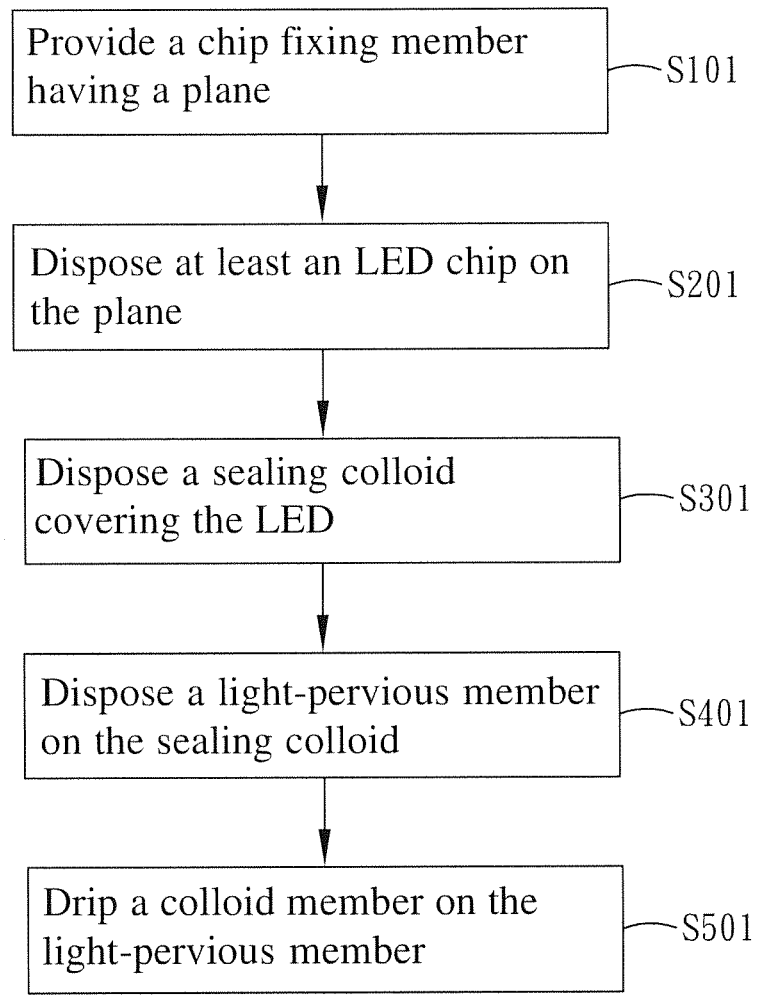
FIG. 6 shows a flowchart for manufacturing the package structure of LED module according the third embodiment of the present invention.

Please refer to FIG. 5 and FIG. 6, which show a three-dimensional view of and a flowchart for manufacturing the package structure of LED module according the third embodiment of the present invention. As shown in the figures, the third embodiment of the present invention changes the structure and method according to the first embodiment. In the step S101, a chip fixing member 11 provided. The chip fixing member 11 includes a plane 140. A first electrode 121 and a second electrode 131 are disposed on the sides of the plane 140. Next, in the step S201, at least one LED chip 40 is disposed on the plane 140. The LED chip 40 has a first electrical connecting wire 410 and a second electrical connecting wire 420. The first electrical connecting wire 410 is connected to the first electrode 121 and the second electrical connecting wire 420 is connected to the second electrode 131 for forming electrical circuitry. Then, in the step S301, use a sealing colloid 70 to cover the LED chip 40. The sealing colloid 70 is a transparent colloid material. Afterwards, in the step S401, a light-pervious member 20 is disposed on the sealing colloid 70. Finally, in the step S501, the chip fixing member, the LED chip 40, the sealing colloid 70, and the light-pervious member 20 are used for forming a light-emitting module 51. The light-emitting module 51 uses the first and second electrodes 121, 131 for connecting electrically the internal and external circuits of the sealing colloid 70. In addition, a colloid material is disposed on the light-pervious member 20 by dripping for forming at least a colloid member 30. The colloid member 30 is a transparent colloid material. Due to the surface tension of the colloid material, the structure has a thick center and a thin periphery, enabling the lens effect. Besides, the surface of the colloid member 30 is curved.

Figure 7:
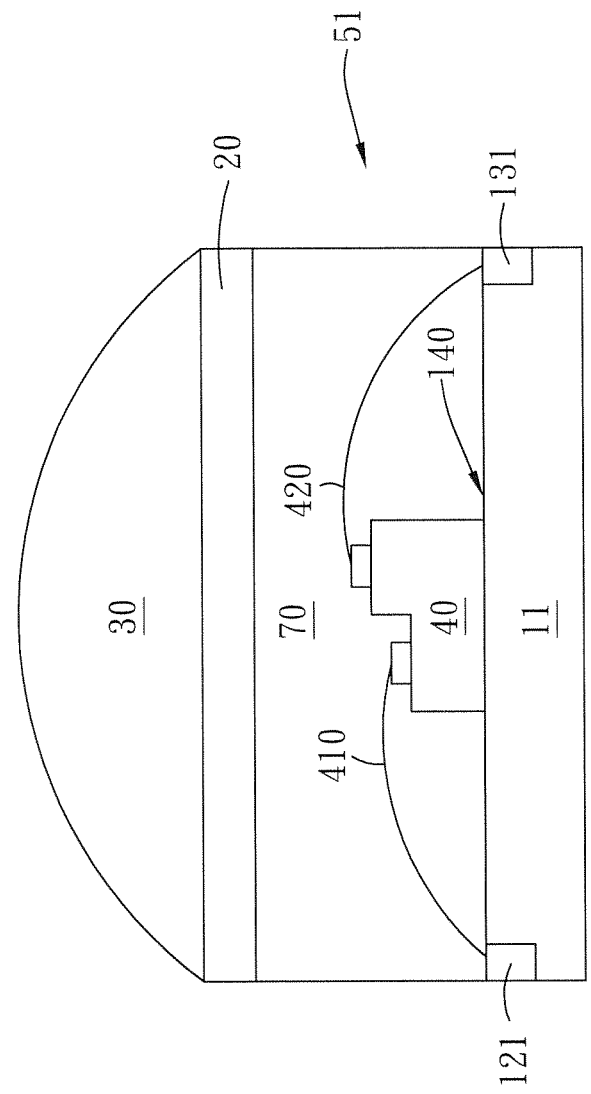
FIG. 7 shows a cross-sectional view of the package structure of LED module according the third embodiment of the present invention.
Figure 8:
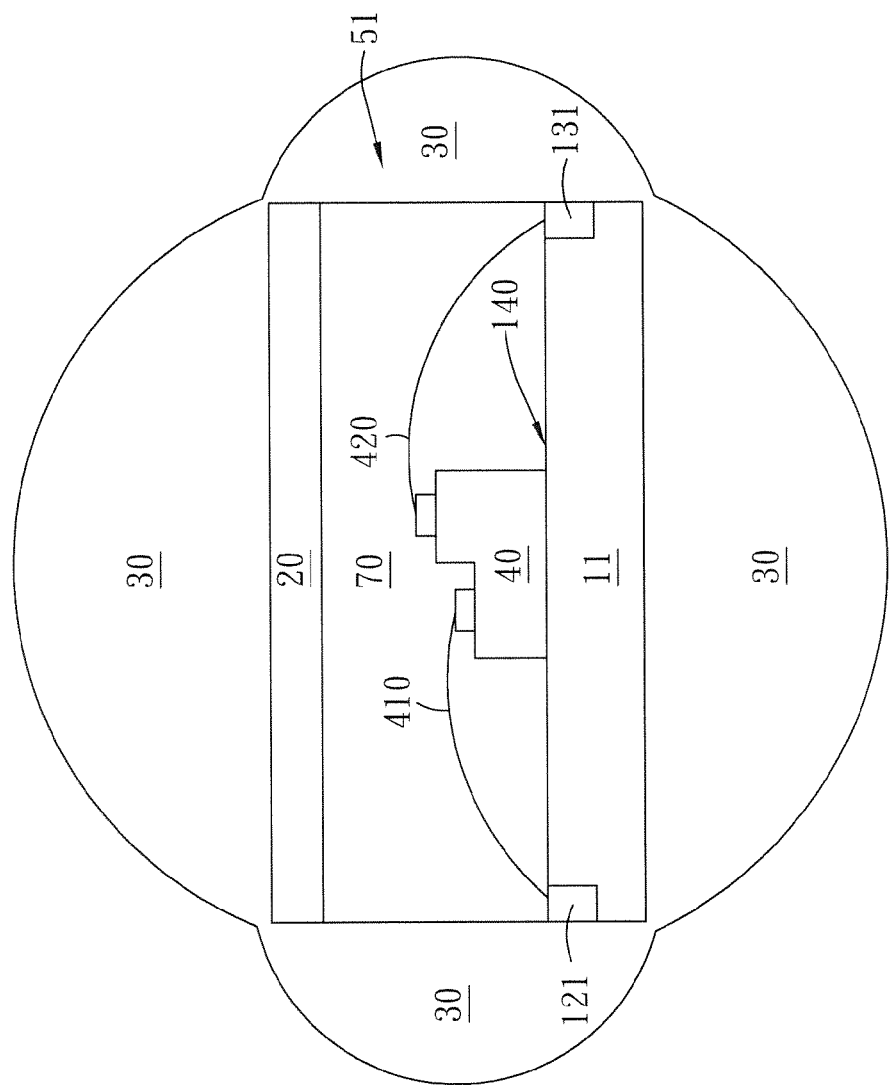
FIG. 8 shows a cross-sectional view of the package structure of LED module according the fourth embodiment of the present invention.

Please refer to FIG. 7 and FIG. 8, which show cross-sectional views of the package structure of LED module according the third and fourth embodiments of the present invention. As shown in the figures, the third and fourth embodiments of the present invention are shown. The third and fourth embodiments are the same as the first and second embodiments. The difference is only on the structure of the light-emitting module 51. In the second embodiment, the chip fixing member 11 is also a transparent structure. Hence, the details will not be described again. Furthermore, both of the third and fourth embodiments include a plurality of LED chips 40 on the plane 140. The light-emitting module 51 is thus formed by the chip fixing member 11, the light-pervious member 20, the sealing colloid 70, and the plurality of LED chips 40. The chip fixing member 11, the light-pervious member 20, and the colloid member 30 are all transparent structures. The chip fixing member 11 and the light-pervious member 20 can be glass or transparent ceramics. The sealing colloid 70 and the colloid member 30 are silica gel materials, silica gel composite materials, epoxy resin, or epoxy resin composite materials. Besides, the fluorescent powder 60 (not shown in the figures) can cover the light-emitting paths of the plurality of LED chips 40. Consequently, the plurality of LED chip 40 can be adjusted for emitting the required color of light.

To sum up, the present invention provides a package structure of LED module and the method for manufacturing the same. The present invention mainly provides the chip fixing member 10 having the recess 110. At least an LED chip 40 is disposed in the recess 110. Then the light-pervious member 20, which is a transparent structure, covers the recess 110. At least a colloid member 30 is dripped on the light-pervious member 20. The colloid member 30 is a transparent structure having a thick center and a thin periphery. In addition, the chip fixing member 11 is used as well. The chip fixing member 11 has the plane 140. At least an LED chip 40 is disposed on the plane 40. The sealing colloid 70 is further disposed for covering the LED chip 40. Next, the light-pervious member 20 is disposed on the sealing colloid 70 and is a transparent structure. The colloid member 30 is a transparent structure having a thick center and a thin periphery. Furthermore, the chip fixing members 10, 11 are transparent structures. At least a colloid member 30 is dripped on one side of the light-emitting modules 50, 51. Alternatively, the colloid member 30 can cover the light-emitting paths of the light-emitting modules 50, 51 completely. According to the present invention, the light-pervious member 20 and the colloid member 30 are disposed on the light-emitting paths of the light-emitting modules 50, 51 for reducing the total reflection in the package. Hence, the present invention is endowed with nonobviousness and novelty.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A method for manufacturing a light-emitting diode module, comprising steps of:
   providing a light-emitting module including at least a light-emitting diode disposed in a recess of a chip fixing member, and said chip fixing member is a transparent structure;
   disposing a light-pervious member in the light-emitting path of said light-emitting module, and said light-pervious member being a transparent structure; and
   dripping a plurality of colloid members on said light-pervious member and a plurality of surrounding surfaces of the light-emitting module respectively, and each said colloid member forming a transparent structure having a thick center and a thin periphery owing to the surface tension of the colloid material.

2. The method for manufacturing a light-emitting diode module of claim 1, wherein said colloid member is silica gel, silica gel composite material, epoxy resin, or epoxy resin composite material.

3. The method for manufacturing a light-emitting diode module of claim 1, wherein said light-pervious member is glass or transparent ceramics.

4. A package structure of light-emitting diode module, comprising:
   a chip fixing member, having a recess, and having at least a light-emitting diode disposed in said recess;
   a light-pervious member, used for covering said recess, and being a flat transparent structure; and
   a plurality of colloid members, disposed on said light-pervious member and surrounding the light-emitting module, and being a plurality of transparent structures;
   wherein said chip fixing member is a transparent structure.

5. The package structure of light-emitting diode module of claim 4, wherein said light-pervious member is glass or transparent ceramics.

6. The package structure of light-emitting diode module of claim 4, wherein said colloid member is silica gel, silica gel composite material, epoxy resin, or epoxy resin composite material.

7. The package structure of light-emitting diode module of claim 4, wherein said recess is filled with air, transparent colloid material, or fluorescent powder.

8. A package structure of light-emitting diode module, comprising:
   a chip fixing member, having a plane, and having at least a light-emitting diode disposed on said plane;
   a sealing colloid, covering said light-emitting diode chip, and being a transparent structure;
   a light-pervious member, disposed on said sealing colloid, and being a flat transparent structure; and
   a plurality of colloid members, disposed on said light-pervious member and surrounding the light-emitting module, and being a plurality of transparent structures
   wherein said chip fixing member is a transparent structure.

9. The package structure of light-emitting diode module of claim 8, wherein said light-pervious member is glass or transparent ceramics.

10. The package structure of light-emitting diode module of claim 8, wherein said colloid member is silica gel, silica gel composite material, epoxy resin, or epoxy resin composite material.

11. The package structure of light-emitting diode module of claim 8, wherein said sealing colloid is mixed with fluorescent powder.

* * * * *